United States Patent [19]

Shima

[11] Patent Number: 5,045,713
[45] Date of Patent: Sep. 3, 1991

[54] MULTI-FEEDBACK CIRCUIT APPARATUS

[75] Inventor: Takeshi Shima, Kanagawa, Japan

[73] Assignee: Kabushiki Kaisha Toshiba, Kawasaki, Japan

[21] Appl. No.: 476,602

[22] Filed: Feb. 7, 1990

[30] Foreign Application Priority Data

Feb. 10, 1989 [JP] Japan .................. 1-29609

[51] Int. Cl.$^5$ .................................. G06F 7/00
[52] U.S. Cl. .................. 307/201; 307/491; 364/807
[58] Field of Search ............... 307/201, 491, 494, 529, 307/553–554; 364/513, 807

[56] References Cited

U.S. PATENT DOCUMENTS

| 4,827,161 | 5/1989 | Kunitoki et al. | 307/491 |
| 4,873,661 | 10/1989 | Tsividis | 307/201 X |
| 4,874,963 | 10/1989 | Alspector | 364/807 X |
| 4,926,064 | 5/1990 | Tapang | 364/513 X |
| 4,948,992 | 8/1990 | Bukowski, Jr. | 307/494 X |
| 4,951,239 | 8/1990 | Andes et al. | 307/201 X |
| 4,962,323 | 10/1990 | Ta | 307/491 X |
| 4,962,342 | 10/1990 | Mead et al. | 307/201 |

FOREIGN PATENT DOCUMENTS 0121987 5/1988 Japan .................. 307/201

OTHER PUBLICATIONS

Hollis and Paulos, "Artificial Neuons Using Analog Multipliers", Dept. Elect. & Comp. Eng., N.C. State U. Raleigh, N.C., manuscript rec'd 12-1988.

Primary Examiner—David Hudspeth
Attorney, Agent, or Firm—Oblon, Spivak, McClelland, Maier & Neustadt

[57] ABSTRACT

A multi-feedback circuit apparatus is provided which can prevent undesired oscillation or chaos phenomena that inevitably arise when the Hopfield model is realized by electronic circuits. The apparatus can also reduce the number of synapse nodes in the neural network model.

8 Claims, 6 Drawing Sheets

MULTI-FEEDBACK CIRCUIT APPARATUS

BACKGROUND OF THE INVENTION

1. Field of the Invention

This invention relates to a multi-feedback circuit apparatus, and more particularly to a multi-feedback circuit apparatus for performing advanced parallel computation modeled after a neural network of a living body.

2. Description of the Prior Art

A multi-feedback circuit apparatus which is called the Hopfield model proposed by Dr. J. J. Hopfield, et al. has been known. The apparatus is to be applied to various fields such as character recognition, speech recognition, optimization in general, and neuro-computers. The Hopfield model is one of the techniques useful to model a neural network of a living body by the use of electronic circuits. Specifically, nerve cell circuits, which exhibit nonlinear analog response are interconnected through symmetrical synapse nodes so as to constitute a neural network model. These nerve cell circuits are modeled after nerve cells of a living body (see Science, vol. 233, Aug. 8, 1986). Here, the Hopfield model will be described with reference to FIG. 10.

In FIG. 10, a plurality of operational amplifiers OP1, OP2 . . . OPi, which respectively have sigmoid input-output characteristics, are provided in parallel. The respective positive input terminals (+) of the operational amplifiers OP1, OP2 . . . OPi are grounded. Further, input impedance such as Z1, Z2 . . . Zi, a plurality of synapse nodes, and input current sources I1, I2 . . . Ii are connected to the respective negative input terminals (−) of the operational amplifiers OP1, OP2 . . . OPi. Here, the synapse nodes are constituted by feedback resistors R11 . . . R1i, R1j, R21 . . . R2i, R2j, and Ri1 . . . Rii, Rij. The input impedance such as Z1, Z2 . . . Zi are circuits having input resistors $\rho_1, \rho_2 \ldots \rho_i$ and input capacitors C1, C2 . . . Ci, connected in parallel, respectively.

The output terminals OUT1, OUT2 . . . OUTi of the operational amplifiers OP1, OP2 . . . OPi are connected to the feedback resistors R11 . . . R1i, R1j, R21 . . . R2i, R2j, and Ri1 . . . Rii, Rij through feedback paths F1 . . . Fi, Fj. As a result, a synapse node square matrix configuration can be formed. The conductances of the respective feedback resistors are so designed as to be symmetrical with respect to a dot-and-dash diagonal line. In other words, the feedback resistors R11 and Rij, R21 and Rii, and R1i and R2j are respectively determined to be the identical conductance. Hereinafter, such conductance is typically represented by Tij.

The local behavior of this model can be expressed by the following ordinary differential equation;

$$C_i \cdot \delta U_i / \delta t = -U_i/R_i + \sum_j (T_{ij} \cdot V_j) + I_i$$

$$V_i = g(U_i)$$

$$1/R_i = 1/\rho_i + \sum_j T_{ij}$$

where Ui represents input currents of the amplifiers OP1, OP2 . . . OPi, and t represents time. Further, g has the following characteristics;

$$g : (-\infty, +\infty) (-1, +1),$$

in the presence of an odd function, a monotonous increment and an inverse function which are primarily differentiable. However, a sigmoid function is usually selected as g.

The overall behavior of this model circuit will be described. The response of the circuit indicates that the behavior of the circuit is to be converged on a stable equilibrium solution. In order to mathematically secure this, a square matrix which has the above-described Tij as elements must satisfy prescribed conditions such as being symmetrical and the like. This concept has been explained by taking the following energy function, which is based on the variation principle, into consideration;

$$E = -(\tfrac{1}{2}) \sum_i \sum_j (T_{ij} \cdot V_i \cdot V_j) - \sum_i (I_i \cdot V_i) + \sum_j (U_i \cdot V_i)$$

Namely, the overall behavior of the Hopfield model circuit is such that the Outputs V1, V2 . . . Vi of the amplifiers OP1, OP2 . . . OPi are varied so as to decrease the value of this energy E. In general, a stable equilibrium solution of this circuit can be obtained using. Tij as parameters. Here, assume that "NP complete" (non-polynominal order compliexity) problems, which are called combination problems and cannot be solved by the order of a polynominal expression, are translated into these parameters. In this case, this circuit solves the given problems as optimization problems (see U.S. Pat. No. 4,719,591).

However, when the Hopfield model is simulated by numerical calculation or realized by actual electronic circuits, the following undesired phenomena are likely to arise. Specifically, they are;

(1) The apparatus inevitably finds an equilibrium solution at a pseudo-minimum value before the energy E reaches its true minimum value.

(2) The apparatus oscillates or exhibits so-called chaos phenomena, in which the apparatus inevitably follows the locus of oscillation. The phenomenon (1) is caused by the fact that an equilibrium solution, in which the energy E reaches its true minimum value, is invariably equal to a sOlutiOn in the case when t is assumed as $t \to \infty$. However, the reverse does not necessarily hold true. In this case, a solution to be obtained does not necessarily satisfy limitations included in a given problem. Thus, some considerations are generally needed to escape from an undesired minimum solution.

Conventionally, there has been a simulated annealing technique to meet such need by use of electronic circuits (see Science, vol 220, May 13, 1983). This technique was verified by Dr. Geman and Geman (see IEEE Trans., vol PAMI-6, 1984). According to the technique, a strategic temperature control can be realized so that the energy E reaches its true minimum value at a time when the circuit finds an equilibrium solution. In Other words, the undesired phenomenon (1) can be eliminated by use of electronic circuits. For example, noises having prescribed probability distribution are superimposed on input signals of the amplifiers (see Neural Information processing System, Denver, 1987). The oscillation phenomena (2) can occur when the square matrix that includes the sYnapse nodes is not symmetrical. In general, when some of the synapse nodes are missing at random in the Hopfield model circuit, the dynamic stability of the model circuit is substantially free from adverse effects. However, when synapse nodes are asymmetric in terms of the structure of the Hopfield model circuit, the oscillation phenomena (2) inevitably occurs therein.

In some particular cases, the harmonized oscillation derived from the oscillating phenomena and the oscillation phenomena might become a required calculation result. For example, in the case of a pattern generator in the central nervous system of a measuring worm, such oscillating phenomena are necessary to achieve its peristaltic motion.

However, in most cases, such oscillating phenomena become very disadvantageous when the stable equilibrium solution at a minimum energy value is assumed to be the calculation results of the circuit Particularly when the circuit is to be realized be use of an integrated circuit, the variations in the values of respective elements, which occur inevitably in the manufacturing process, cause the synapse nodes in the circuit to be asymmetric. Specifically, the feedback resistors R11 and Rij, R21 and Rij, and R1i and R2j, the respective pairs of which must have the same conductance, inevitably have a different conductance. As a result, the above-described disadvantages (1) and (2) cannot be avoided.

SUMMARY OF THE INVENTION

Accordingly, one object of the present invention is to provide a multi-feedback circuit apparatus that can prevent the occurrence of the above-described disadvantages (1) and (2), which have been unavoidable in a conventional Hopfield Model when realized by use of an integrated circuit.

Briefly, in accordance with one aspect of this invention, there is provided a multi-feedback circuit apparatus which comprises N units for providing nonlinear conversion performance, each unit including a pair of terminals, one terminal being an input terminal and the other terminal being an output terminal, and changeover devices provided in each of the units, the changeover devices defining one terminal of the pair of terminals as an input terminal or as an output terminal, and also defining the other terminal of the pair of terminals as an output terminal or as an input terminal in accordance with a given control signal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
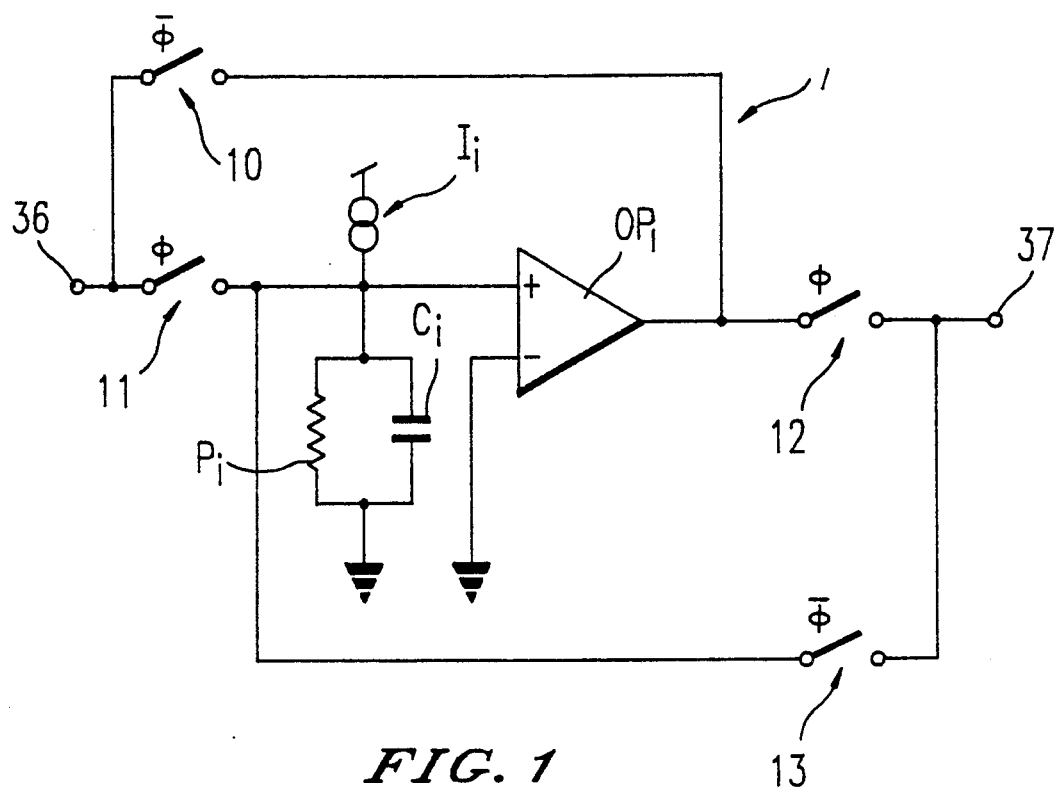
FIG. 1 is a circuit diagram illustrating an essential portion of a first embodiment according to the present invention.
Figure 10:
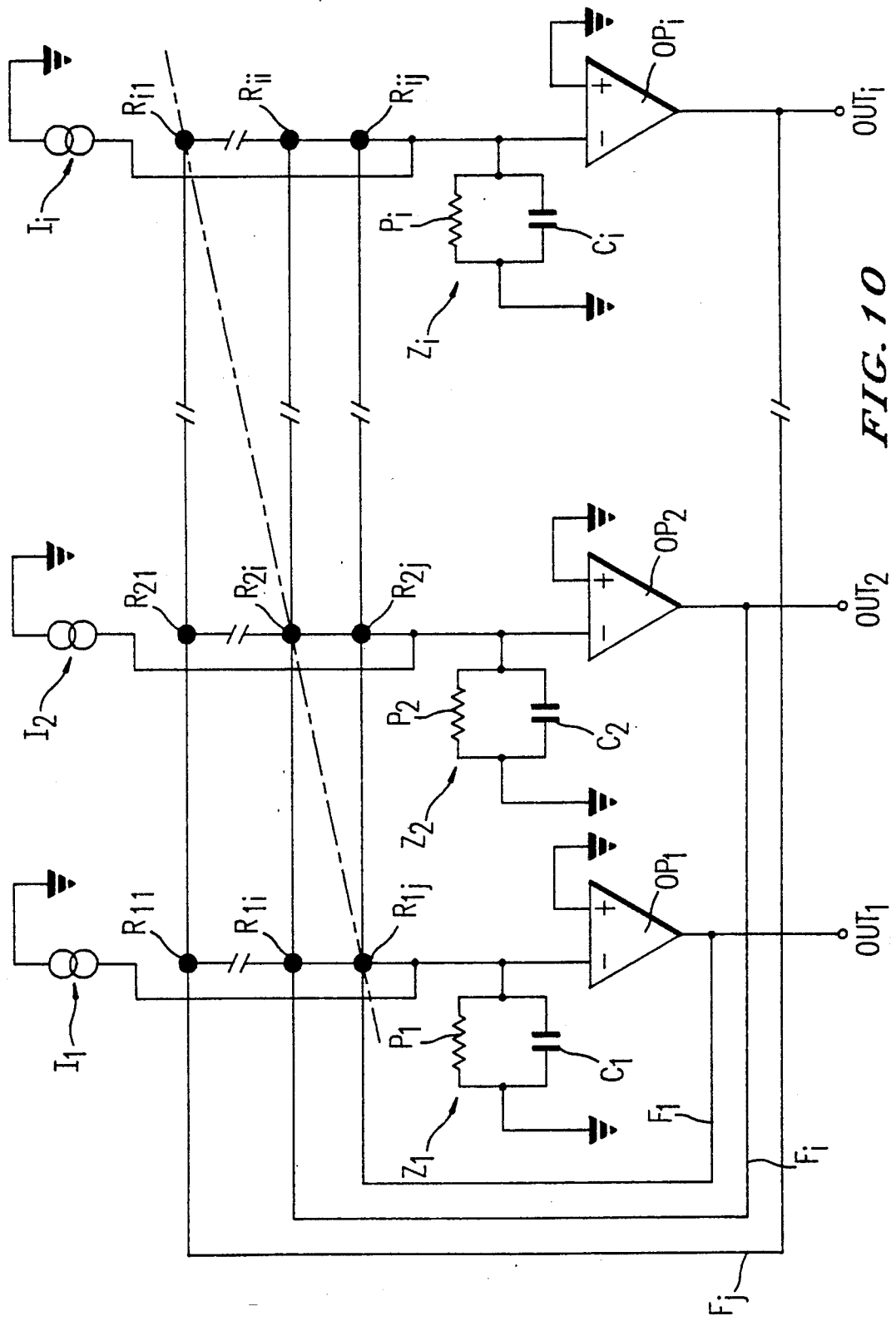
FIG. 10 is a circuit diagram for explaining a conventional technique.

Referring now to the drawings, wherein like reference numerals designate identical or corresponding parts throughout the several view, and more particularly to FIG. 1 thereof, a first embodiment of this invention will be described. FIG. 1 shows a nerve cell circuit 7 having an operational amplifier OPi that produces only a negative output, while the operational amplifiers OP1 through OPi of FIG. 10 produce only a positive output, which the operational amplifier realizes the above-described sigmoid function.

In FIG. 1, a first forward phase switch 11 is connected between a terminal 36 and a positive input terminal (+) of the operational amplifier OPi. A second forward phase switch 12 is connected between a terminal 37 and an output terminal of the operational amplifier OPi. A first inverse phase switch 10 is connected between the terminal 36 and the output terminal of the operational amplifier OPi. A second inverse phase switch 13 is connected between the positive input terminal (+) of the operational amplifier OPi and the terminal 37.

Figure 4:
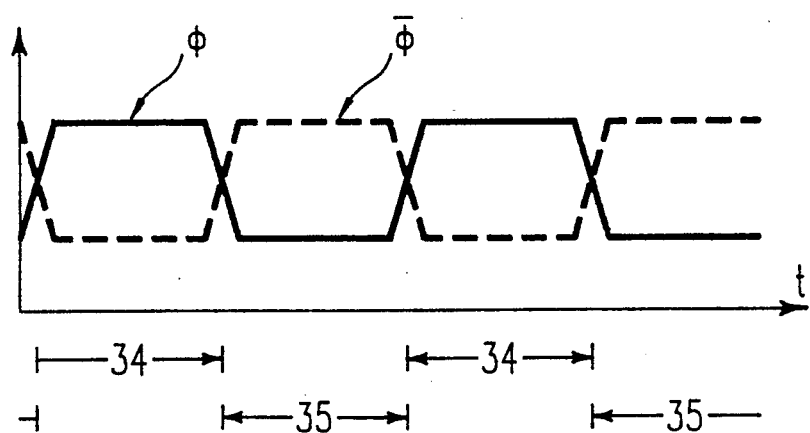
FIG. 4 is a signal waveform diagram fOr explaining the operation of the first embodiment according to the present invention.

The operation of the nerve cell circuit 7 of FIG. 1 will be described with reference to FIG. 4. FIG. 4 is a waveform diagram illustrating a forward phase control signal $\phi$ and an inverse phase control signal $\bar{\phi}$. In FIG. 4, a solid line represents the forward phase control signal $\phi$, and a dotted line represents the inverse phase control signal $\bar{\phi}$. The abscissa represents time, and reference numerals 34 and 35 respectively represent time periods. The first and second forward phase switches 11 and 12 of FIG. 1 are opened and closed in accordance with the forward phase control signal $\phi$. The first and second inverse phase switches 10 and 13 of FIG. 1 are opened and closed in accordance with the inverse phase control signal $\bar{\phi}$.

Specifically, the first and second forward phase switches 11 and 12 are closed, and the first and second inverse phase switches 10 and 13 are opened during the period 34. In this case, the nerve cell circuit 7 has the terminal 37 as an output terminal, and has the terminal 36 as an input terminal. Further, the first and second forward phase switches 11 and 12 are opened, and the first and second inverse phase switches 10 and 13 are closed during the period 35. Thus, contrary to the above, the nerve cell circuit 7 has the terminal 37 as an input terminal, and has the terminal 36 as an output terminal. In other words, the terminals 36 and 37 of the nerve cell circuit 7 serve as an input or an output terminal depending on the phase control signals $\phi$ and $\bar{\phi}$.

Figure 2:
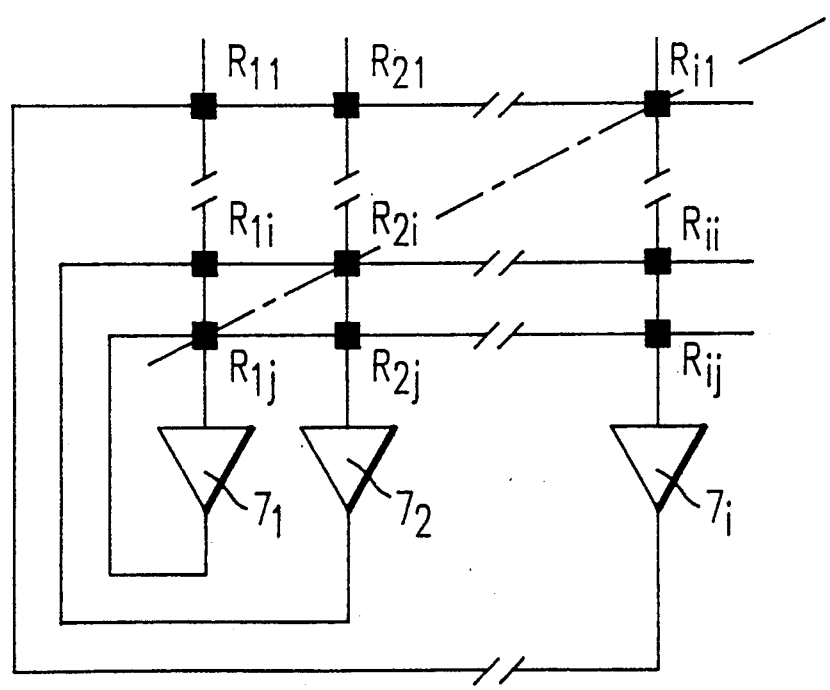
FIG. 2 is a schematic circuit diagram illustrating a network of the first embodiment according to the present invention.

FIG. 2 shows a network that comprises a plurality of nerve cell circuits $7_1, 7_2 \ldots 7_i$, each of which has the same configuration as that shown in FIG. 1. The network further comprises feedback resistors R11 ... R1i, R1j, R21 ... R2i, R2j and Ri1 ... Rii, Rij connected in a square matrix fashion. Each of the feedback resistors constitutes an individual synapse node. Assume that the nerve cell circuits $7_1, 7_2 \ldots 7_i$ are phase-controlled by use of the forward/inverse phase control signals $\phi$ and $\bar{\phi}$. In this case, the outputs of the nerve cell circuits $7_1$, $7_2$ ... $7_i$ are multi-fed back depending on the periods 34 and 35 shown in FIG. 4. Thus, the appearances of the synapse nodes differ depending on the periods 34 and 25.

Theoretically, the conductances of the feedback resistors, which constitute synapse nodes to be connected between the output of a nerve cell circuit i and the input of a nerve cell circuit j, appear to be Tij or Tji when observed from the nerve cell circuit i depending on the phase controlled by signals $\phi$ and $\bar{\phi}$. Here, assume that the nerve cell circuit i has input capacitance C1 and input resistance $\rho 1$, which determine a time constant thereof. Further, the periods of the signals $\phi$ and $\bar{\phi}$ are determined to be sufficiently smaller than the time constant of the nerve cell circuit i. In this case, the conductances at positions (i, j) and (j, i) on a square matrix can both be regarded as (Tij + Tji) /2

Specifically, in FIG. 2, the conductances of the feedback resistors R11 ... R1i, R1j, R21 ... R2i, R1j, and Ri1 ... Rii, Rij at positions symmetrical with respect to the dot-and-dash diagonal line can be regarded as identical. Here, notice the feedback resistors R11 and Rij. Both the conductances T11 and Tij of the feedback resistors R11 and Tij appear identical to each other when the nerve cell circuit 7i is phase-controlled by the signal $\phi$ and $\bar{\phi}$ in the manner described above. Namely, the conductances T11 and Tij are equalized to be (T11 + Tij)/2. Thus, the asymmetry of the synapse nodes which inevitably arises when the circuit 7 is realized by an integrated circuit, can be easily avoided.

Figure 3:
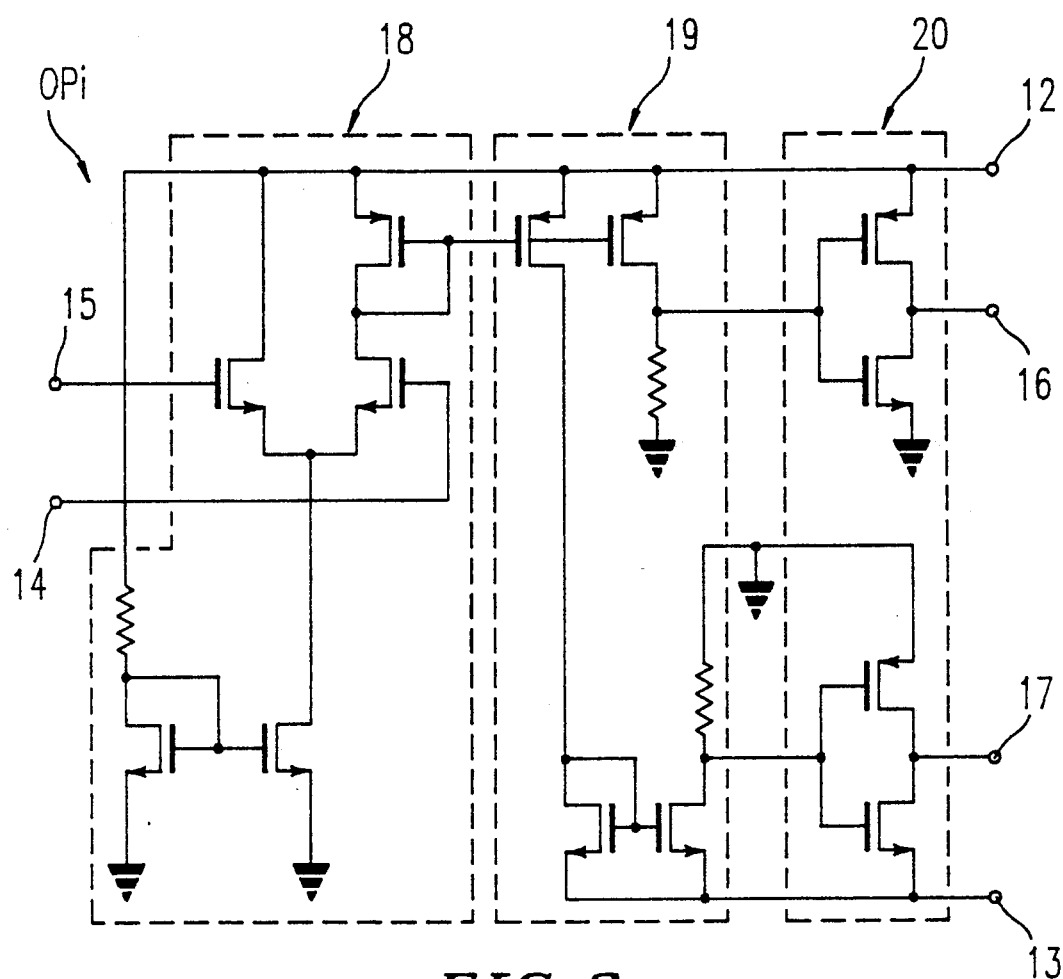
FIG. 3 is a circuit diagram illustrating an amplifier employed in the first embodiment according to the present invention.

The operational amplifier OPi shown in FIG. 1 can be realized by a circuit shown in FIG. 3. In FIG. 3, an operational amplifier OPi comprises a positive input terminal 15, a negative input terminal 14, a differential amplifier stage 18, a level shifter stage 19, and an inverter state 20. The amplifier OPi further comprises an positive output terminal 16, a negative output terminal 17, a positive power source terminal 12, and a negative power source terminal 13.

Figure 5:
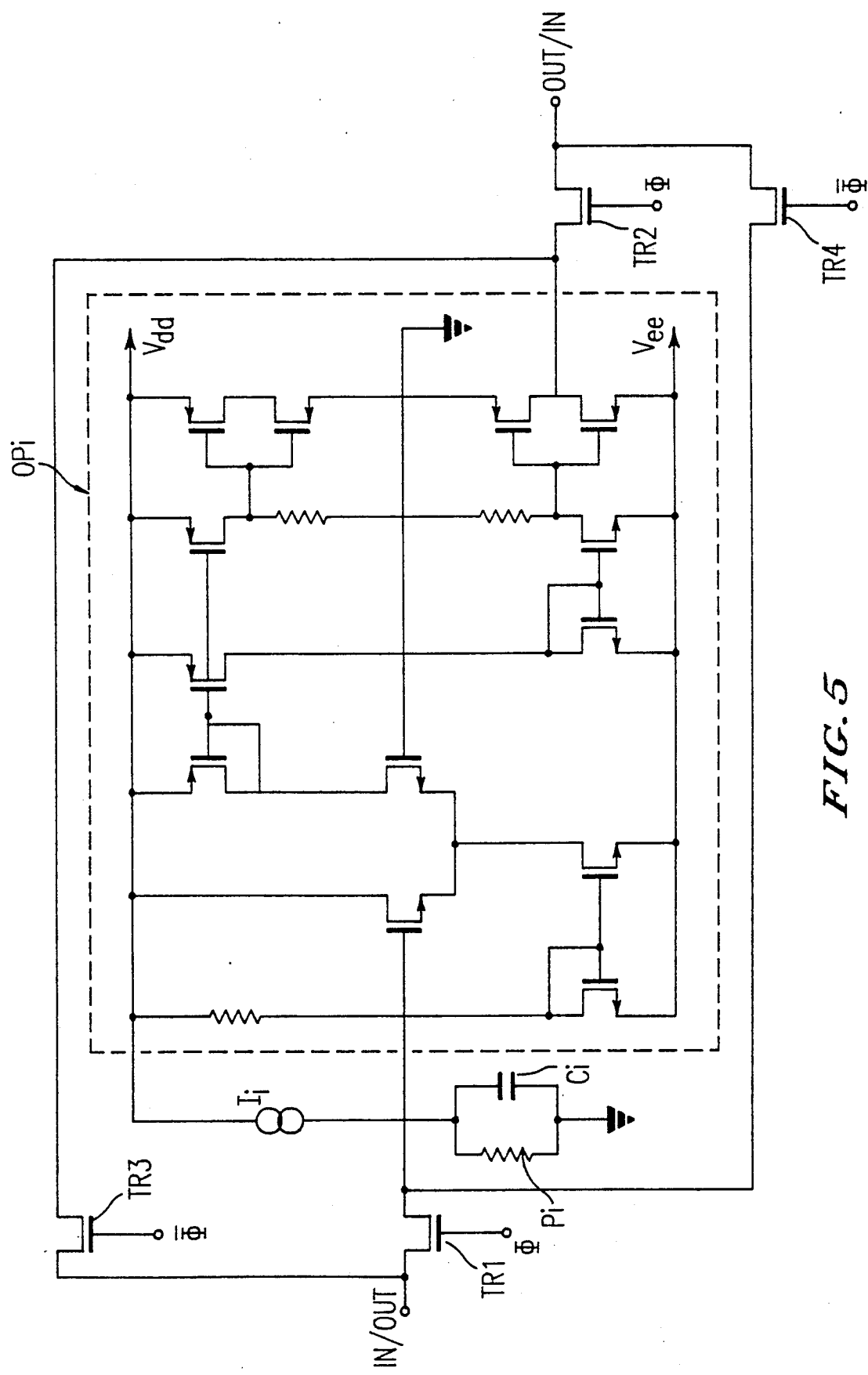
FIG. 5 is a detailed circuit diagram of FIG. 1.

FIG. 5 is a detailed circuit diagram of the first embodiment shown in FIG. 1. In FIG. 5, the portion surrounded by a dotted line represents the operational amplifier OPi shown in FIG. 3. Further, switches, which are operated in accordance with forward and inverse phase control signals $\phi$ and $\bar{\phi}$, are constituted by MOS transistors TR1 through TR4.

Figure 6:
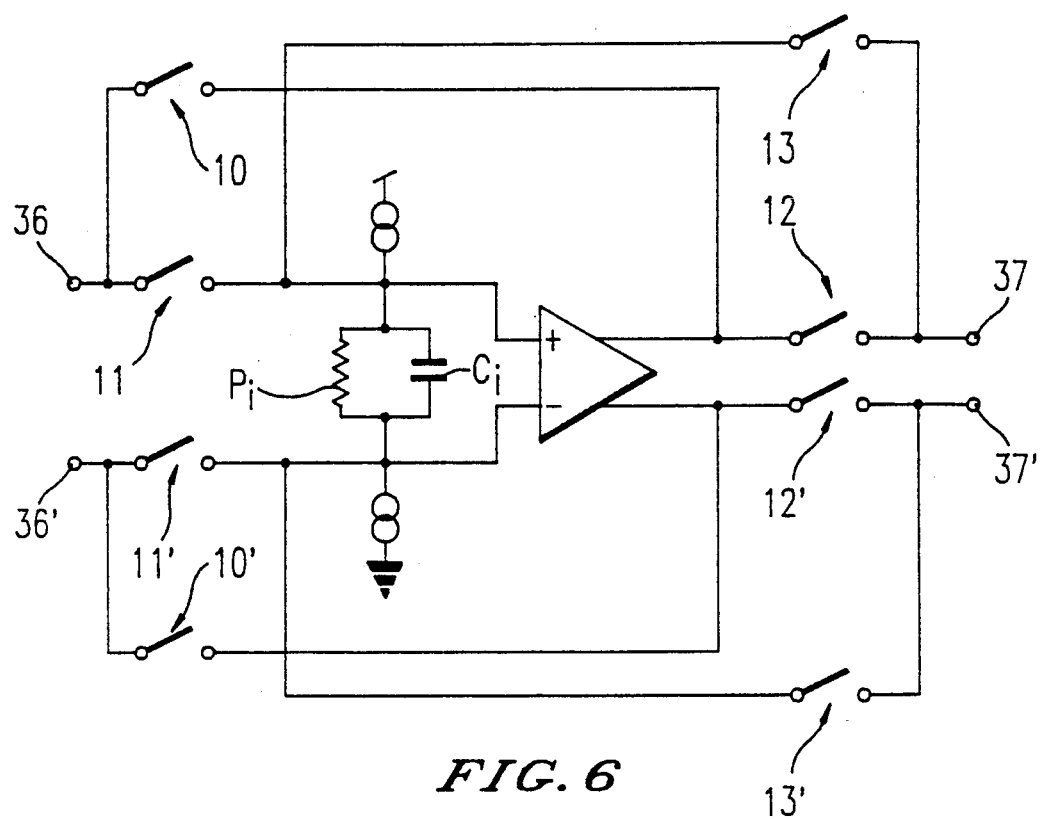
FIG. 6 is a circuit diagram illustrating an essential portion of a second embodiment according to the present invention.
Figure 7:
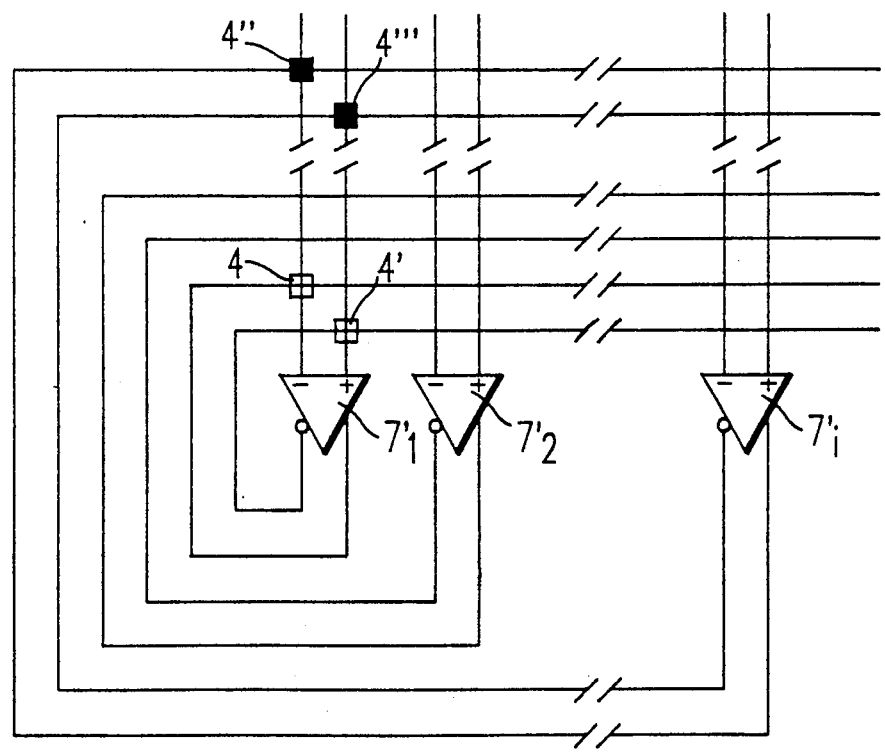
FIG. 7 is a schematic circuit diagram illustrating a network of the second embodiment according to the present invention.

Next, a second embodiment of this invention will be described with reference to FIGS. 6 and 7. FIG. 6 shows a nerve cell circuit 7' that receives a differential input, and produces a differential output. FIG. 7 shows a network which comprises a plurality of the nerve cell circuits 7'. In FIG. 6, the circuit 7' has a positive input terminal 36, a negative input terminal 36', a positive Output terminal 37 and a negative output terminal 37'. In FIG. 7, a synapse node 4 is provided between the positive output terminal and the negative input terminal of a nerve cell circuit $7_1'$. Further, a synapse node 4' is provided between the negative output terminal and the positive input terminal of the nerve cell circuit $7_1'$. Here, the performances of the synapse nodes 4 and 4' are equaivalent to each other. Thus synapse nodes 4 and 4' can be defined as a pair of nodes. As a result, the input offset and DC bias of the amplifiers can be substantially eliminated.

Figure 8:
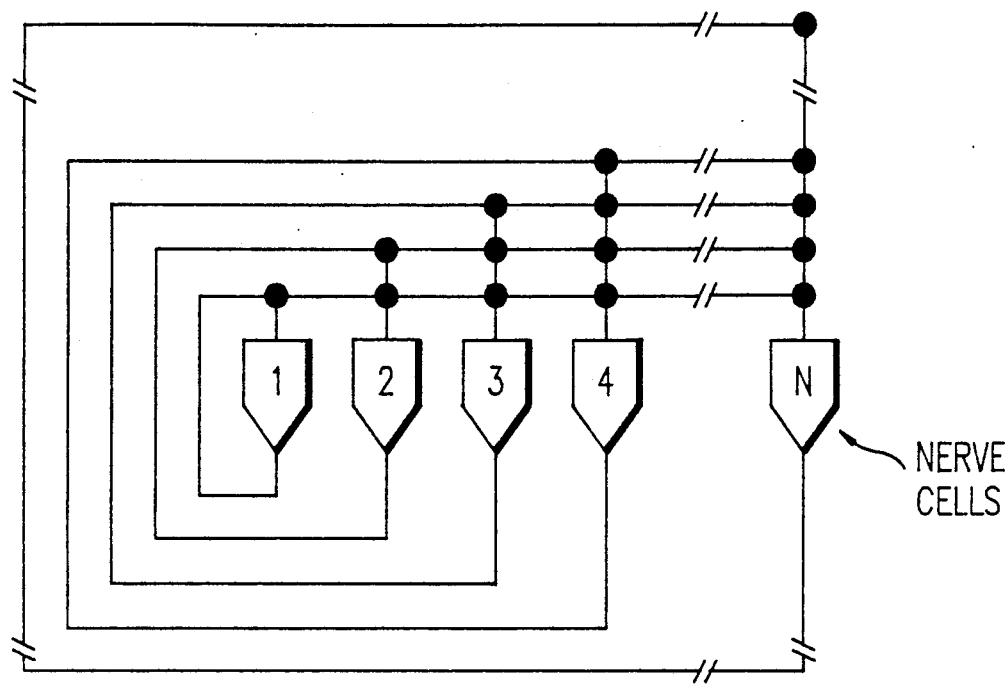
FIG. 8 is a schematic circuit diagram illustrating a network of a third embodiment according to the present invention.

Next, a third embodiment of this invention will be described with reference to FIG. 8, wherein a network thereof is illustrated. In this embodiment, the number of synapse nodes can be reduced to about ½. Specifically, the conductances at positions (i, j), and (j, i) on a square matrix are both theoretically regarded as (Tij + Tji)/2; as described above. If (Tij +Tji)/2 is held, even when Tji = 0, the result equals Tij/2. In FIG. 8, when the number of the nerve cell circuits is determined to be N, the number of the synapse nodes must be $N^2$ in the conventional technique. The synapse nodes can be reduced to $(N^2 - N)/2 + N$. This reduction is significantly advantageous in terms of the chip area when the circuit is realized by an LSI (large scale integrated) circuit.

Figure 9:
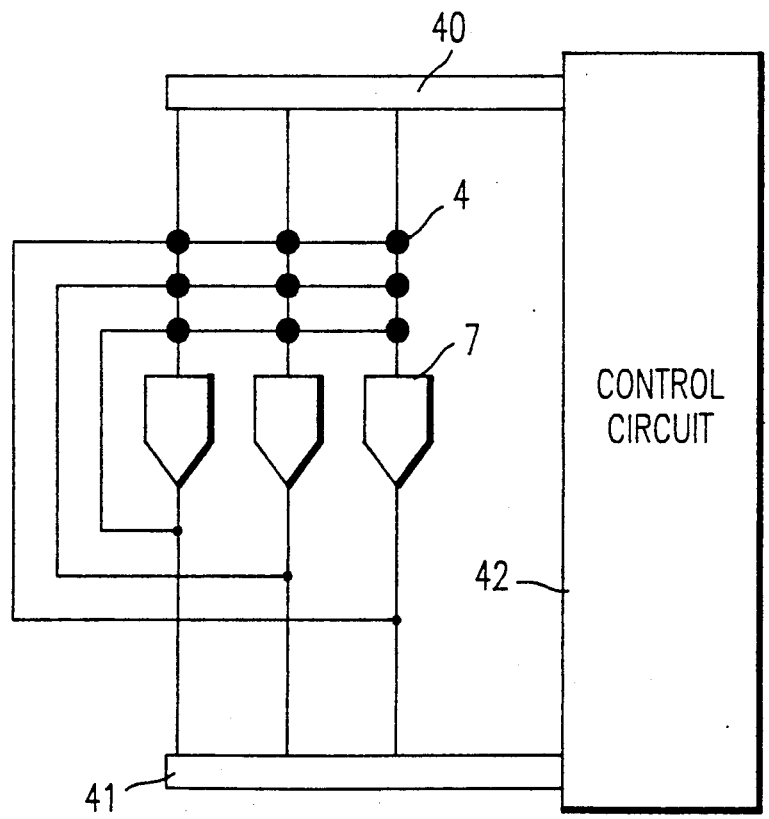
FIG. 9 is a schematic circuit diagram illustrating a network of a fourth embodiment according to the present invention.

Next, a fourth embodiment of this invention will be described with reference to FIG. 9. In FIG. 9, a network comprises a plurality f nerve cell circuit 7, synapse nodes 4 and a control circuit 42. In FIG. 9, the network is operated in the following procedures. Specifically, 1 all of forward phase switches and inverse phase switches, which are incorporated in the nerve cell circuits 7, are maintained to be opened. 2 The values of the synapse nodes 4 are determined by the control circuit 42 through a first control bus 40 and a second control bus 41. As a result, the individual conductance of each of the synapse nodes can be determined. The thus determined individual conductance can be stored for a long time by use of MNOS (metal nitride oxide semiconductor) or EEPROM (electric erasable programmable read only memory). 3 Thereafter, the first and second control buses 40 and 41 are disconnected from the control circuit 42. The forward and inverse phase switches are operated in accordance with control signals shown in FIG. 4. The network then awaits until it reaches a steady state through a transient transferring state 4. The second control bus 41 is again connected to the control circuit 42. The control circuit 42 received the outputs produced from the respective nerve cell circuits 7 through the second control bus 41. Assume that the network shown in FIG. 9 is operated in accordance with the above-described procedures 1 through 4. In this case, the network can be regarded as an exclusive hard ware design that can solve a given optimization problem when observed from the control circuit 42.

As described above, according to the present invention, there can be provided a multi-feedback circuit apparatus that can prevent undesired oscillation or chaos phenomena which inevitably arise when the Hopfield model is realized by electronic circuits. This has been achieved through study of the basic cause of such undesired phenomena. The apparatus of this invention can also avoid another disadvantage of the Hopfield model, in which an equilibrium solution at a pseudo-minimum is inevitably found before the energy E reaches its true minimum value. This is based on the fact that the inside disturbance caused by the operation of the forward and inverse phase switches influences the circuit of this invention.

Specifically, the disturbance effectively serves to prevent such an equilibrium solution at a pseudo-minimum from being found earlier than expected. Moreover, the circuit of this invention can be easily manufactured in the form of an LSI circuit by eliminating disadvantages of the Hopfield model. Thus, the multi-feedback circuit according to the present invention can be widely applied to various fields such as character recognition, speech recognition, optimization in general, and neuro-computers.

Obviously, numerous additional modifications and variations of the present invention are possible in light of the above teachings. It is therefore to be understood that within the scope of the appended claims, the invention may be practiced otherwise than as specifically described herein.

What is claimed is:

1. In a multi-feedback circuit apparatus having N units for providing nonlinear conversion performance, each unit including a pair of terminals, one terminal being an input terminal and the other terminal being an output terminal, multiplying means and summing means, said multiplying means multiplying respective values at said output terminals of said units by individual coefficients different to each other, said summing means summing the thus multiplied values, whereby the summed values are then fed back, the improvement comprising:

changeover means provided in each of said units, said changeover means defining one terminal of said pair of terminals as an input terminal or as an output terminal, and also defining the other terminal of said pair of terminals as an output terminal or as a input terminal in accordance with a given control signal.

2. The apparatus of claim 1, wherein said terminal defined as an input terminal of each said unit includes a differential input terminal, and said terminal defined as an output terminal of each said unit includes a positive-and-negative output terminal.

3. The apparatus of claim 2, wherein said input terminal of each said unit has an RC time constant circuit.

4. The apparatus of claim 2, wherein said differential input terminal of each said unit is biased by a current source.

5. The apparatus of claim 1, wherein said changeover means includes a first forward phase switch connected between said input terminal of each said unit and a positive input terminal of aa nonlinear amplifier provided in each said unit, a second forward phase switch connected between said output terminal of each said unit and an output terminal of said nonlinear amplifier, a first inverse phase switch connected between said input terminal of each said unit and said output terminal of said nonlinear amplifier, and a second inverse phase switch connected between said positive input terminal of said operational amplifier and said output terminal of each said unit, said first and second forward phase switches being closed only while a forward phase control signal is being applied thereto, and said first and second inverse phase control switches being closed only while an inverse phase control signal is being applied thereto.

6. The apparatus Of claim 5, wherein said forward phase switches and said inverse phase switches respectively include MOS transistors.

7. The apparatus of claim 1, wherein each of said units includes a differential amplifier, means for converting a current output from said differential amplifier into a voltage output having a potential between a positive potential and a ground potential, and means for converting a current output from said differential amplifier into a voltage output having a potential between ground potential and a negative potential.

8. The apparatus of claim 1, wherein said multiplying means have means for determining said coefficient and means for observing the outputs of said units.

* * * * *